(12) United States Patent
LaPalme

(10) Patent No.: US 12,733,143 B2
(45) Date of Patent: Sep. 8, 2026

(54) NESTED RF SHIELD SYSTEM FOR A TUNER CIRCUIT

(71) Applicant: DISH Wireless L.L.C., Littleton, CO (US)

(72) Inventor: Jerome A. LaPalme, Aurora, CO (US)

(73) Assignee: DISH Wireless L.L.C., Littleton, CO (US)

( * ) Notice: Subject to any disclaimer, the term of this patent is extended or adjusted under 35 U.S.C. 154(b) by 382 days.

(21) Appl. No.: 18/302,463

(22) Filed: Apr. 18, 2023

(65) Prior Publication Data

US 2023/0371220 A1 Nov. 16, 2023

Related U.S. Application Data

(60) Provisional application No. 63/341,337, filed on May 12, 2022.

(51) Int. Cl.
*H05K 1/02* (2006.01)
*H05K 9/00* (2006.01)

(52) U.S. Cl.
CPC ......... *H05K 9/0032* (2013.01); *H05K 1/0216* (2013.01); *H05K 9/006* (2013.01)

(58) Field of Classification Search
CPC .... H05K 9/0032; H05K 1/0216; H05K 9/006; H05K 2201/10371
See application file for complete search history.

(56) References Cited

U.S. PATENT DOCUMENTS 6,377,472 B1 * 4/2002 Fan ...................... H05K 9/0032 174/385
8,928,434 B2 * 1/2015 Kwon ................. H04N 21/426 334/85
9,345,183 B2 * 5/2016 Cochrane ............ H05K 9/0009

* cited by examiner

*Primary Examiner* — Imani N Hayman
*Assistant Examiner* — Hung Q Dang
(74) *Attorney, Agent, or Firm* — Kilpatrick Townsend & Stockton LLP

(57) ABSTRACT

Various arrangements of a nested radio frequency (RF) shield system are detailed herein. The system can include an internal RF shield that includes one or more tabs to be soldered to a printed circuit board (PCB). The system can further include an external RF shield that also includes tabs that are soldered to a PCB. When the internal RF shield and the external RF shield are installed on the PCB, protrusions of the shields nest together to block RF without requiring the shields be soldered together.

16 Claims, 8 Drawing Sheets

NESTED RF SHIELD SYSTEM FOR A TUNER CIRCUIT

CROSS REFERENCE TO RELATED APPLICATIONS

This application claims priority to U.S. Provisional Patent Application No. 63/341,337, filed on May 12, 2022, the disclosure of which is incorporated by reference in its entirety for all purposes.

BACKGROUND

Many products, such as consumer products, get disposed of after use and end up in a landfill. Some entities, however, will refurbish products and redeploy them to other customers. For example, a television service provider may provide customers with a set top box (STB) to access a television subscription. When the customer's subscription ends or an equipment upgrade is provided, the previously-used equipment may be serviced and redeployed to another subscriber.

During servicing, some number of parts of the STB may need to be replaced, such as damaged or malfunctioning components. For efficiency, the ability to quickly replace components without causing damage to other components of the STB is beneficial.

SUMMARY

Various embodiments are described related to a nested radio frequency (RF) shield system. In some embodiments, a nested radio frequency (RF) shield system is described. The system may comprise an internal RF shield. The internal RF shield may comprise a first metallic housing. The internal RF shield may comprise a first plurality of tabs to be soldered to a printed circuit board (PCB), the first plurality of tabs attached with the first metallic housing. The internal RF shield may comprise a first plurality of protrusions present on the first metallic housing; and an external RF shield comprising a second metallic housing. The external RF shield may comprise an RF connected attached with the second metallic housing. The external RF shield may comprise a second plurality of tabs to be soldered to the PCB. The external RF shield may comprise a second plurality of protrusions present on the second metallic housing. When the internal RF shield and the external RF shield are installed on the PCB, the first plurality of protrusions and the second plurality of protrusions may nest together.

Embodiments of such a system may include one or more of the following features: each protrusion of the first plurality of protrusions and the second plurality of protrusions may be concave in shape. Each protrusion of the second plurality of protrusions may have a larger radius than each protrusion of the first plurality of protrusions. The external RF shield may further comprise a plurality of retaining tabs. When the internal RF shield and the external RF shield are installed on the PCB, the plurality of retaining tabs may cause force to be exerted between the first plurality of protrusions and the second plurality of protrusions. The external RF shield may further comprise an F-type connector that passes through the second metallic housing. The nested RF shield system may be installed with a television set top box (STB).

In some embodiments, a method for performing shielding of a tuner circuit is described. The method may comprise installing an internal RF shield by soldering a plurality of tabs of the internal RF shield to a printed circuit board (PCB). The method may comprise positioning an external RF shield onto the PCB such that a first plurality of protrusions of the internal RF shield and a second plurality of protrusions of the external RF shield nest together. The method may comprise, after positioning the external RF shield onto the PCB, solder a second plurality of tabs of the external RF shield onto the PCB.

Embodiments of such a method may include one or more of the following features: removing solder from the second plurality of tabs of the external RF shield. The method may further comprise removing the external RF shield from the PCB while leaving the internal RF shield installed. The method may further comprise positioning a second external RF shield onto the PCB such that the first plurality of protrusions of the internal RF shield and a third plurality of protrusions of the second external RF shield nest together. The method may further comprise, after positioning the second external RF shield onto the PCB, soldering a third plurality of tabs of the external RF shield onto the PCB. Positioning the external RF shield onto the PCB may comprise sliding the second plurality of protrusions onto the first plurality of protrusions. The method may further comprise, after positioning the external RF shield onto the PCB, causing force between the internal RF shield and the external RF shield to be exerted, the force caused by a retaining tab inserted into the PCB. The method may further comprise connecting an F-type connector present on the external RF shield with a coaxial cable that may be connected with an external antenna.

In some embodiments, a set top box is described. The set top box may comprise a tuner circuit. The set top box may comprise an internal RF shield. The internal RF shield may comprise a first metallic housing. The internal RF shield may comprise a first plurality of tabs to be soldered to a printed circuit board (PCB), the first plurality of tabs attached with the first metallic housing. The internal RF shield may comprise a first plurality of protrusions present on the first metallic housing. The set top box may comprise an external RF shield comprising a second metallic housing. The external RF shield may comprise an RF connected attached with the second metallic housing. The external RF shield may comprise a second plurality of tabs to be soldered to the PCB. The external RF shield may comprise a second plurality of protrusions present on the second metallic housing. The tuner circuit may be located within the internal RF shield. When the internal RF shield and the external RF shield are installed on the PCB, the first plurality of protrusions and the second plurality of protrusions may nest together.

Embodiments of such a device may include one or more of the following features: each protrusion of the second plurality of protrusions may have a larger radius than each protrusion of the first plurality of protrusions. The external RF shield further may comprise a plurality of retaining tabs. When the internal RF shield and the external RF shield are installed on the PCB, the plurality of retaining tabs may cause force to be exerted between the first plurality of protrusions and the second plurality of protrusions. Each protrusion of the second plurality of protrusions may have a different radius than each protrusion of the first plurality of protrusions. The tuner circuit may comprise a plurality of tuners. The external RF shield may further comprise an F-type connector that passes through the second metallic housing and connects with an external dish antenna via coaxial cable.

BRIEF DESCRIPTION OF THE DRAWINGS

A further understanding of the nature and advantages of various embodiments may be realized by reference to the following figures.

DETAILED DESCRIPTION

Detailed herein is a nested radio frequency (RF) shield system and methods of using such a system. A possible use of such a nested RF shield system is to provide shielding of a tuner circuit of a television receiver, such as a STB. The nested RF shield system includes at least two pieces. A first piece of the system, referred to as the internal RF shield, is located within a device (e.g., an STB) and is attached by multiple tabs of the internal RF shield to a printed circuit board (PCB), such as using solder.

While the internal RF shield may be unlikely to be damaged, a second component of the nested RF shield system, the external RF shield, may be more likely to be damaged. The external RF shield may have an attached RF connector, such as a protruding F-type connector, that protrudes outside of the device from the external RF shield. If the device is dropped, hit, or a cable attached to the connector is pulled, damage to the connector and/or external RF shield can occur.

As detailed herein, in a nested RF shield system, the external RF shield and the internal RF shield have nesting protrusions. These nesting protrusions, when nested together, can decrease RF leakage compared to if the nesting protrusions were not nested or not present at all. The nested RF shield system is designed such that it provides a high level of shielding against RF (e.g., frequencies up to 3 GHz), but allows the external RF shield to be replaced significantly easier than if the nested RF shield system was made from a single piece of metal.

These nesting protrusions may press against each other and remain in physical contact, but may not be otherwise attached together, such as using solder. Therefore, if the external RF shield becomes damaged, it can be removed and replaced without damaging or otherwise affecting the internal RF shield of the system. Further detail regarding such embodiments is provided in relation to the figures.

Figure 1:
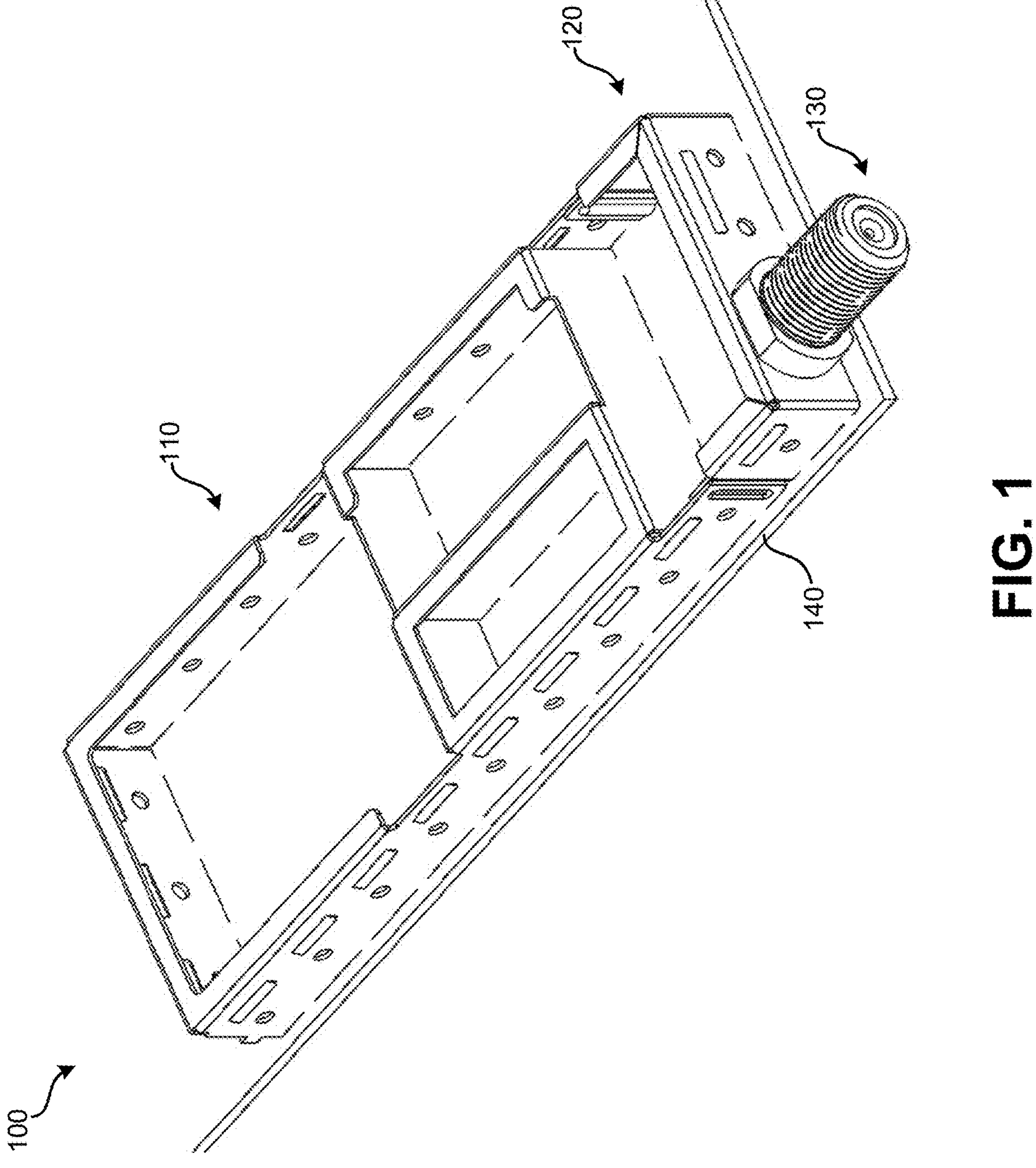
FIG. 1 illustrates an embodiment of a nested RF shield system.

FIG. 1 illustrates an embodiment of a nested RF shield system 100 ("system 100"). In this embodiment, system 100 is used to shield a tuner circuit to prevent interference with other components. A tuner circuit can serve to receive and demodulate signals received from a satellite antenna, such as a dish antenna (e.g., via a coaxial cable connection), that receives streams of television channels from a satellite. In other embodiments, system 100 can be used to provide shielding for some other form of circuit (e.g., to prevent RF from leaking in, leaking out, or both).

System 100 can include two components: internal RF shield 110 and external RF shield 120. Internal RF shield is metallic (or otherwise conductive) and provides RF shielding. Internal RF shield 110 can be divided up into multiple compartments, such as to isolate components from RF leakage. A top layer and bottom layer may be present (not illustrated) to provide RF shielding in the vertical direction. Internal RF shield 110 can be soldered to PCB 140 via multiple tabs. These tabs can be protruding pieces of the metallic housing of internal RF shield 110.

External RF shield 120 is metallic and may be configured to be in contact with internal RF shield 110, be separately soldered to PCB 140, and be attached with one or more connectors that extend outward from system 100. Connector 130 can be a protruding F-type connector. In other embodiments, a different type of connector may be used. The number of connectors present on external RF shield 120 varies by embodiment. By virtue of connector 130 extending outward, it may be more easily damaged than other connector or components installed within system 100 and/or the device in which system 100 is installed.

The particular shape, size, and dimensions of internal RF shield 110 and external RF shield 120 can vary by embodiment. In some embodiments, a different number of subcompartments, if any, may be present within internal RF shield 110.

Figure 2:
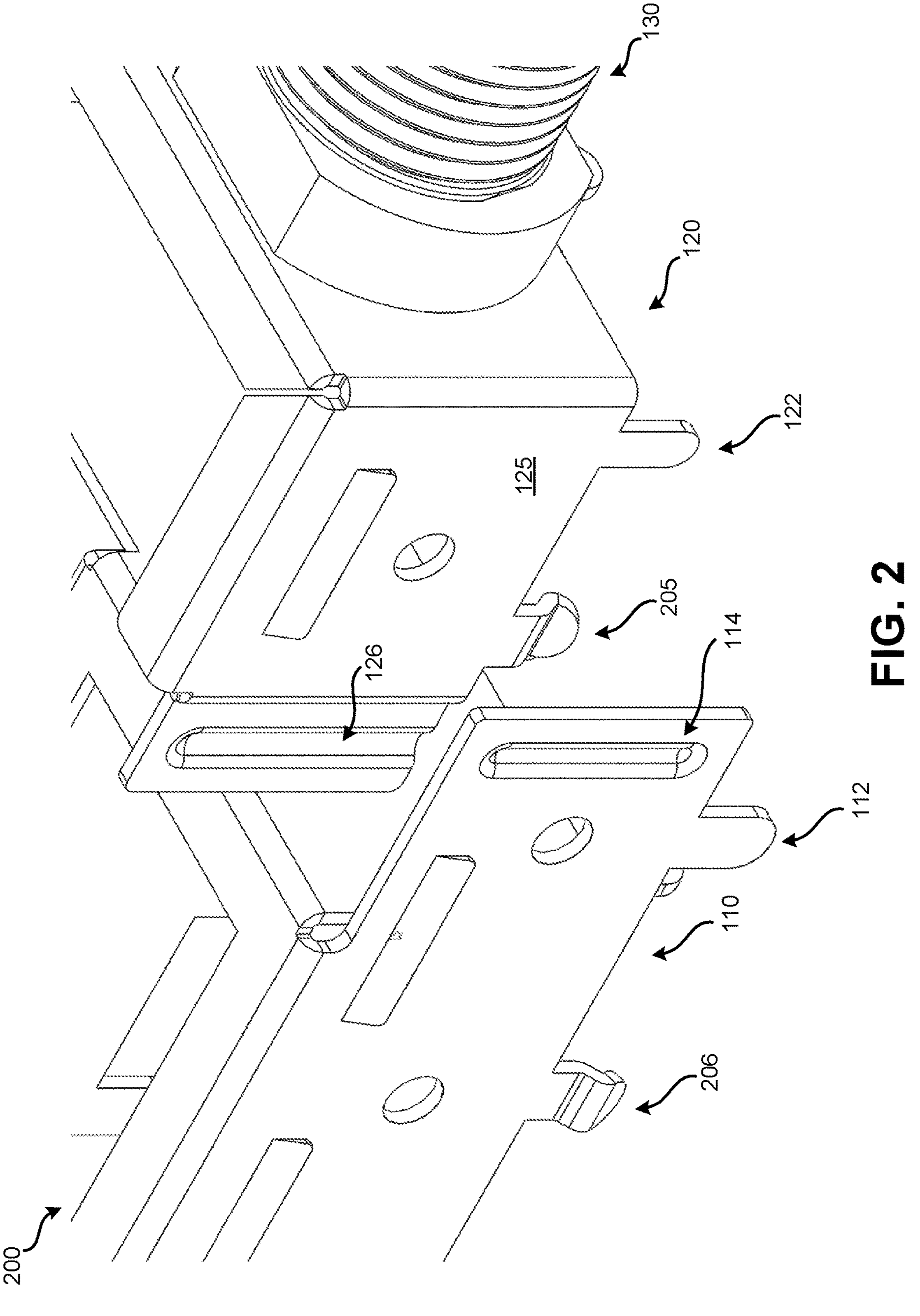
FIG. 2 illustrates an embodiment a nested RF shield system prior to nesting.

FIG. 2 illustrates an embodiment 200 of nested RF shield system 100 prior to nesting. FIG. 2 illustrates a close-up view of where external RF shield 120 and internal RF shield 110 removably nest together. Internal RF shield 110 can include various protruding tabs, such as tab 112, which can be soldered into corresponding through-holes of a PCB (not illustrated) to anchor internal RF shield 110 in place. Alternatively, a surface mount arrangement may be used instead. Similarly, external RF shield 120 can include various protruding tabs, such as tab 122, which can be soldered into a through-hole of a PCB to anchor external RF shield 120 in place. Alternatively, a surface mount arrangement may be used instead.

Internal RF shield 110 further includes protrusion 114. Protrusion 114 can be a rounded cylindrical shape intended to nest with or within protrusion 126 of external RF shield 120. In some embodiments, protrusion 114 is concave in shape such that it fits within a similarly shaped concave protrusion 126 of external RF shield 120. Other shapes are also possible. In some embodiments, the curvature of protrusion 114 can have a larger radius than the curvature of protrusion 126 to ensure contact between the protrusions. (Alternatively, the curvature of protrusion 126 can have a larger radius than the curvature of protrusion 114 to help ensure contact between the protrusions.) Protrusion 114 may have a top that is lower than a top of internal RF shield 110 and a bottom that is higher than a bottom of internal RF shield 110. However, protrusion 126 can extend to the bottom of external RF shield 120 to allow protrusion 126 to be slid onto protrusion 114 when external RF shield 120 is installed.

External RF shield 120 may further include retaining tab 205. When installed in a through-hole in a PCB, retaining tab 205 may cause sidewall 125 and protrusion 126 to move outward, thus causing protrusion 126 to remain in physical contact with protrusion 114 despite no solder joining the protrusions. In other embodiments, retaining tab 205 may be present on internal RF shield 110 instead or retaining tabs may be present on both components. Multiple retaining tabs can be present. For example, retaining tab 206 can be present on internal RF shield 110. Retaining tab 206 can help ensure that protrusion 114 presses against protrusion 126 and contact is maintained.

As illustrated, RF external shield 120 fits partially within internal RF shield 110. In other embodiments, internal RF shield 110 fits partially within RF external shield 120. While FIG. 2 illustrates one side of internal RF shield 110 and external RF shield 120, it should be understood that an additional set of such components are present on the opposite side of system 100.

Internal RF shield 110 is installed prior to installation of external RF shield 120. External RF shield 120 then has protrusion 126 slid down onto protrusion 114 with tab 122 and retaining tab 205 being inserted into corresponding through holes in the PCB. At some point in the future, if replacement or repair or external RF shield 120 is necessary, tab 122 and retaining tab 205 can be desoldered from the PCB, without any cutting or soldering involving internal RF shield 110 needing to be performed.

Figure 3:
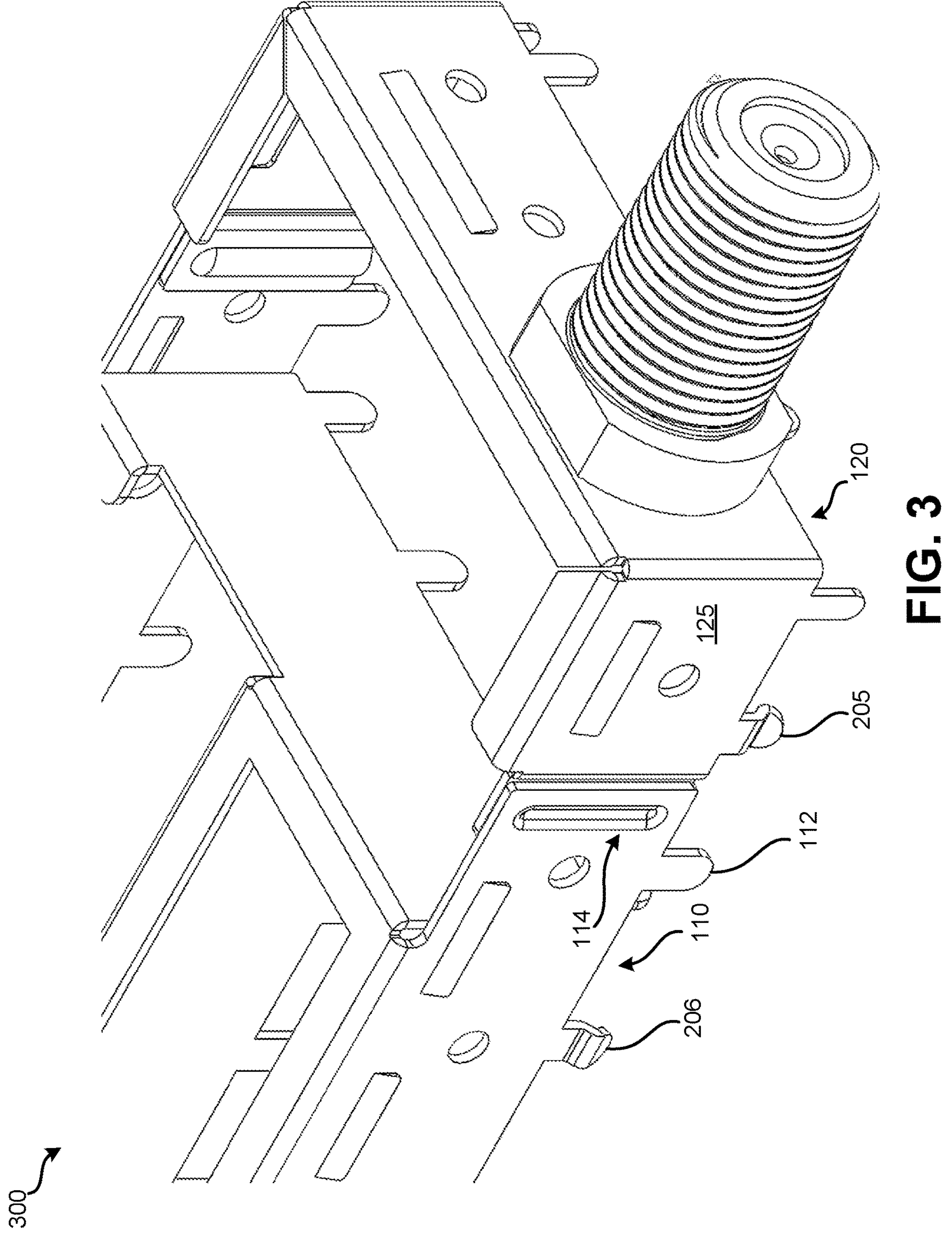
FIG. 3 illustrates an embodiment of a nested RF shield system after nesting.

FIG. 3 illustrates an embodiment 300 of a nested RF shield system 100 after nesting. Force exerted outward by sidewall 125 keeps external RF shield 120 in contact with internal RF shield 110 via protrusions 114 and 126. Further, the shape of protrusions 114 and 126 help prevent RF leakage from occurring where internal RF shield 110 and external RF shield 120 mate.

Figure 4:
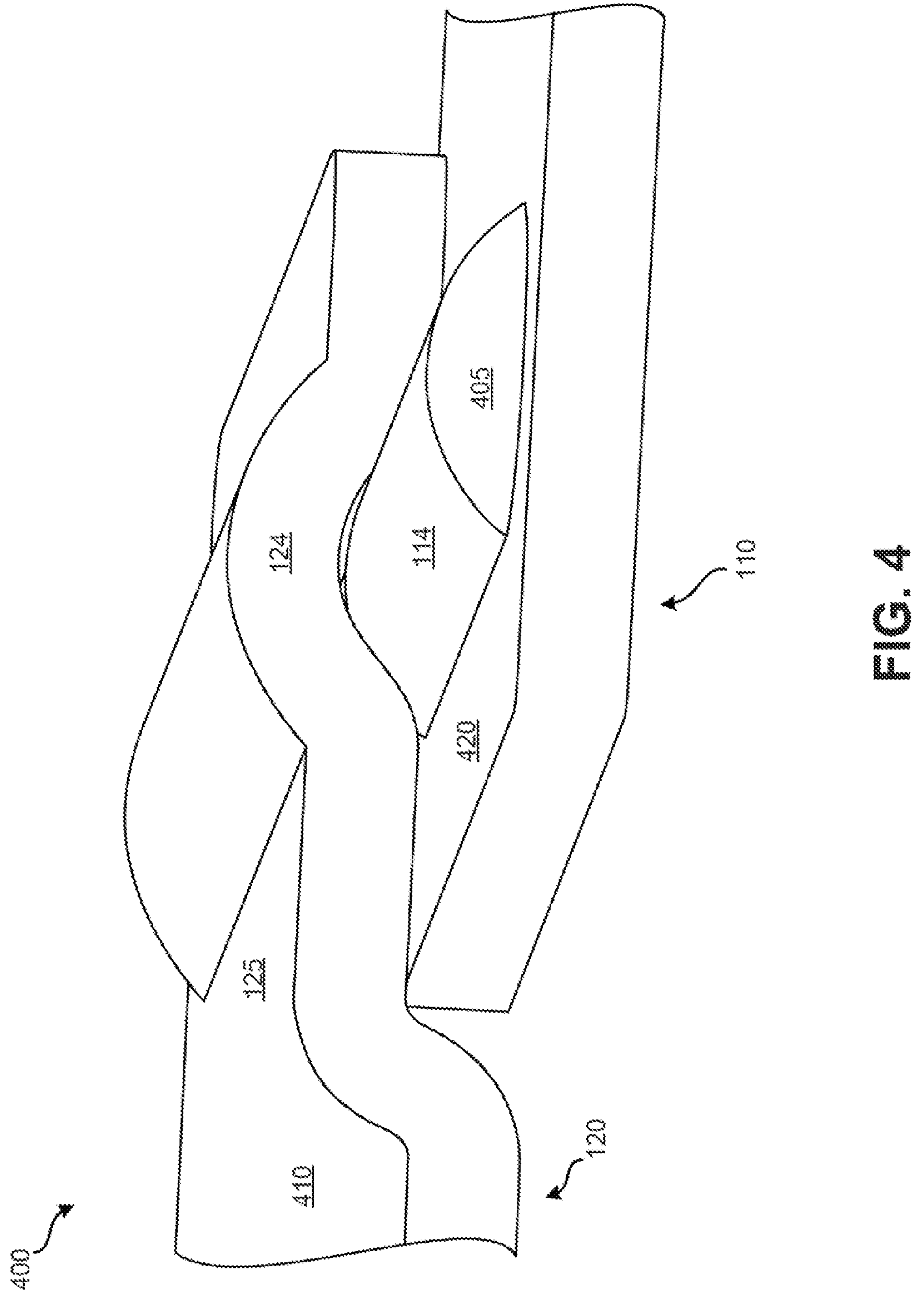
FIG. 4 illustrates the nesting protrusions of the nested RF shield system being partially nested.

FIG. 4 illustrates an embodiment 400 of the nesting protrusions of the nested RF shield system 100 being partially nested. Protrusions 114 and 124 may both be curved or cylindrical. Generally, the radius of protrusions 114 may be slightly larger than the radius of protrusion 124. This difference helps ensure physical contact between the protrusions when internal RF shield 110 is mated with external RF shield 120. In other embodiments, the protrusions may have a same shape and radius. Protrusion 114 may have rounded ends 405 that facilitates sliding protrusion 124 into a nested position with protrusion 114.

To keep system 100 to a particular size, external RF shield 120 may include bend 410 such that protrusion 124 and sidewall 125 overlap with sidewall 420 to an inside of system 100.

Figure 5:
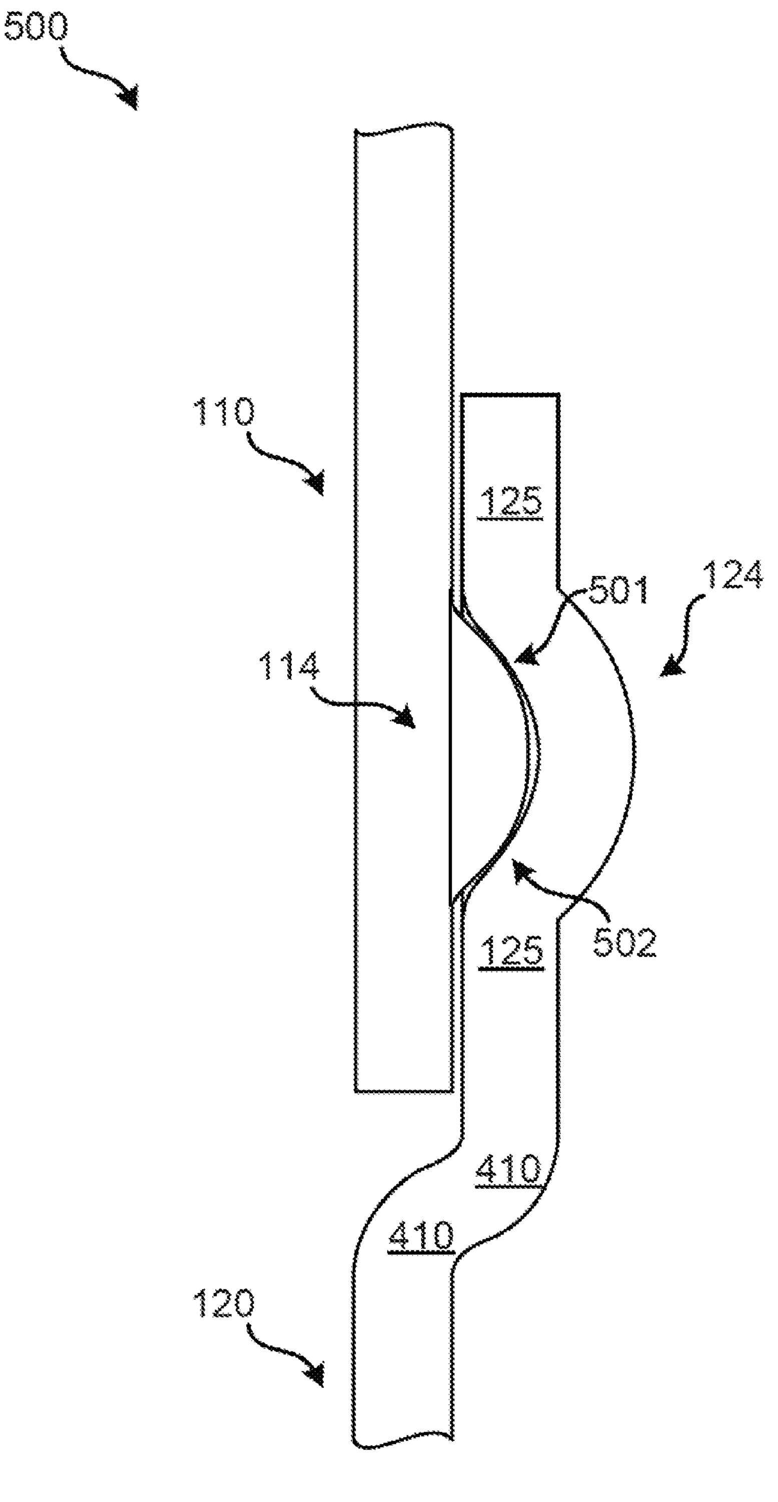
FIG. 5 illustrates a cross-section view of the nesting protrusions of the nested RF shield system.

FIG. 5 illustrates a cross-section view 500 of the nesting protrusions of the nested RF shield system 100. By having protrusion 114 have a larger radius than protrusion 124, contact area 501 and contact area 502, which each stretch a distance along an axis extending perpendicular to the plane of the cross section, are present. In other embodiments, the curvature of protrusions 114 and 124 may be reversed such that the protrusion of external RF shield 120 nests within the protrusion of internal RF shield 110. In such an embodiment, protrusion 124 may have a larger radius than protrusion 114.

Figure 6:
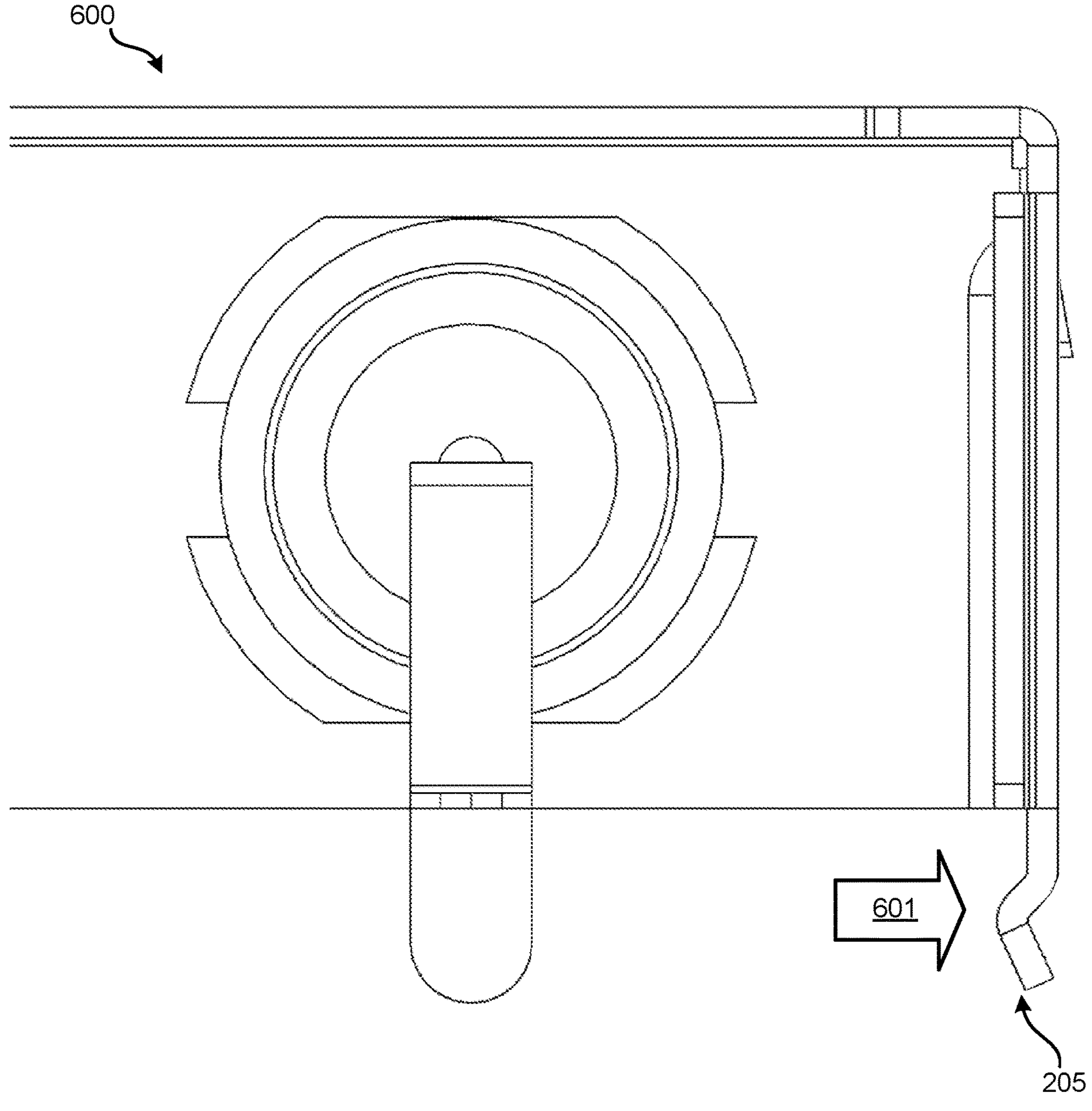
FIG. 6 illustrates an embodiment of a retaining tab that causes force to be exerted between nesting protrusions of the nested RF shield system.

FIG. 6 illustrates an embodiment 600 of retaining tab 205 that causes force to be exerted between nesting protrusions of nested RF shield system 100. When inserted into a through-hole in a PCB, retaining tab 205 causes force to be exerted in direction 601. This force causes contact to be maintained between protrusion 114 and protrusion 126. Retaining tab 205 may be soldered into the PCB through-hole or may remain unsoldered. Referring to FIG. 3, retaining tab 206 can cause force to be exerted in the opposite of direction 601, thus causing internal RF shield 110 and external RF shield 120 to press against each at nesting protrusions 114 and 126.

Figure 7:
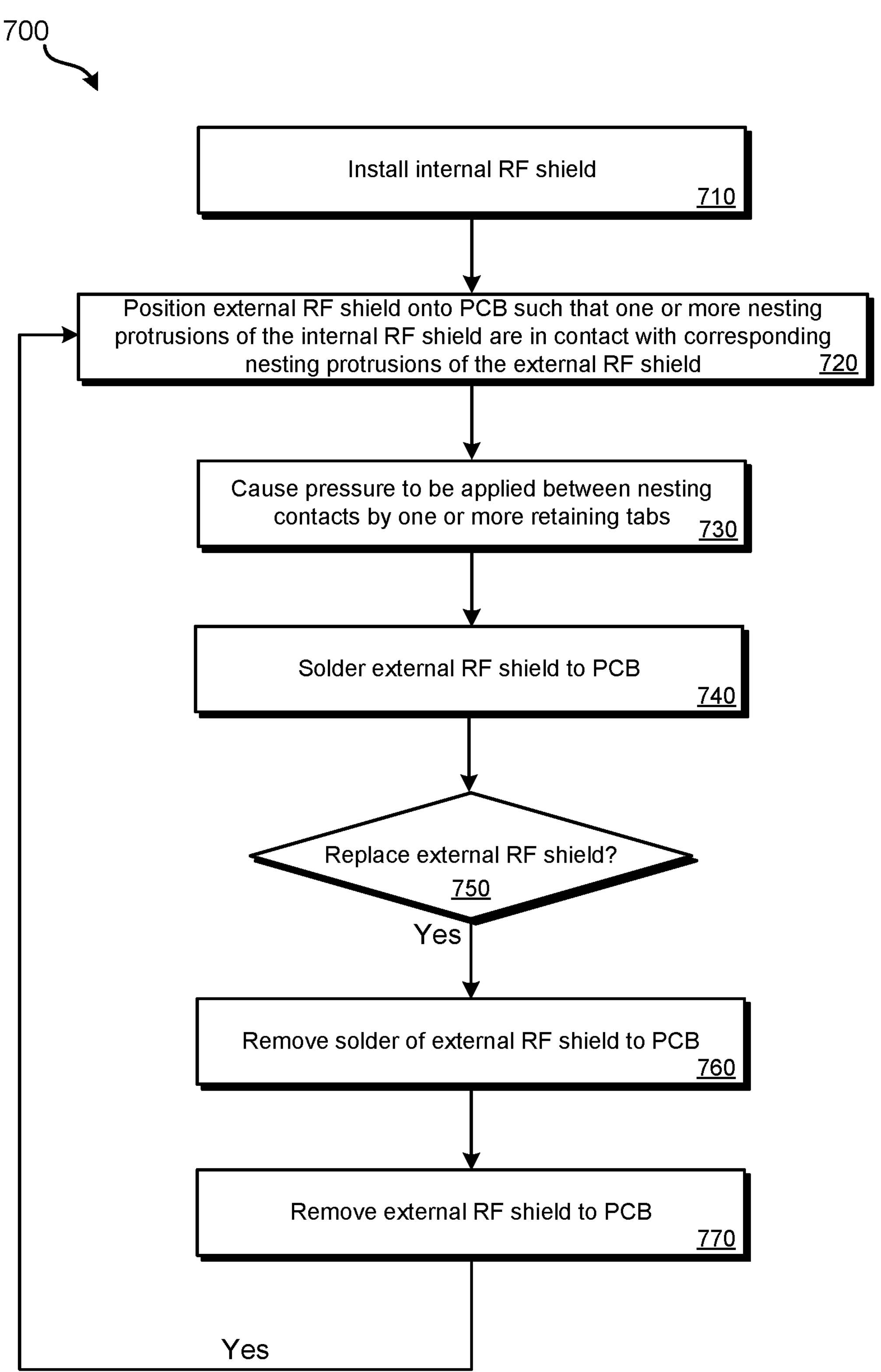
FIG. 7 illustrate an embodiment of a method for using a nested RF shield system.

Various methods may be performed using the embodiments of systems detailed in relation to FIGS. 1-6. FIG. 7 illustrate an embodiment of a method 700 for using a nested RF shield system. Method 700 can be performed using nested RF shield system 100, as detailed within this document. Namely, method 700 can be performed to initially install and, possibly at a later time, replace a damaged external RF shield.

At block 710, an internal RF shield may be installed onto a PCB. Installing the internal RF shield can include soldering one or more tabs within through holes or to surface mount pads of the PCB. This internal RF shield may surround (or will surround) RF componentry, such as a STB tuner.

At block 720, an external RF shield can be positioned onto the PCB such that nesting protrusions of the internal RF shield nest with corresponding nesting protrusions of the external RF shield. In some embodiments, block 720 involves the nesting protrusions of the external RF shield being slid down onto nesting protrusions of the internal RF shield and aligning tabs of the external RF shield with corresponding through-holes or pads on the PCB.

At block 730, one or more retaining tabs may be inserted into a through hole of the PCB, which causes force to be continuously exerted between the nesting protrusions of the internal RF shield in the nesting protrusions of the external RF shield. This force helps eliminate RF leakage by removing any gaps between the internal and external RF shields. The nesting arrangement of the protrusions also helps eliminate RF leakage by eliminating a straight path for RF to leak. Notably, no solder may be present between the protrusions of the external and internal RF shields; rather, contact is maintained at least partially by virtue of the force caused by the retaining tab.

At block 740, the external RF shield may be soldered to the PCB using one or more tabs inserted into through holes of the PCB or placed on surface pads of the PCB. Following block 740 being performed, the device in which the nested RF shield system is installed may be deployed and used. At some time in the future, the external RF shield may become damaged. For example, damage to a connector installed in the external RF shield may occur.

At block 750, a determination is made that the external RF shield is to be replaced, but the internal RF shield system can be left intact. Block 750 may be performed many months or years after block 740. At block 760, solder may be removed that holds the tabs of the external RF shield to the PCB. If solder is present on the retaining tab, such solder may also be removed.

At block 770, the external RF shield is removed from the PCB. This can involve the external RF shield being slid upward to decouple the nested protrusions of the internal and external RF shields. Once removed, method 700 may return to block 720 such that a new external RF shield can be installed. Notably, the internal RF shield does not need to be modified, soldered, or otherwise affected by the external RF shield being replaced. Method 700 can be repeated as often as the external RF shield needs replacement.

Figure 8:
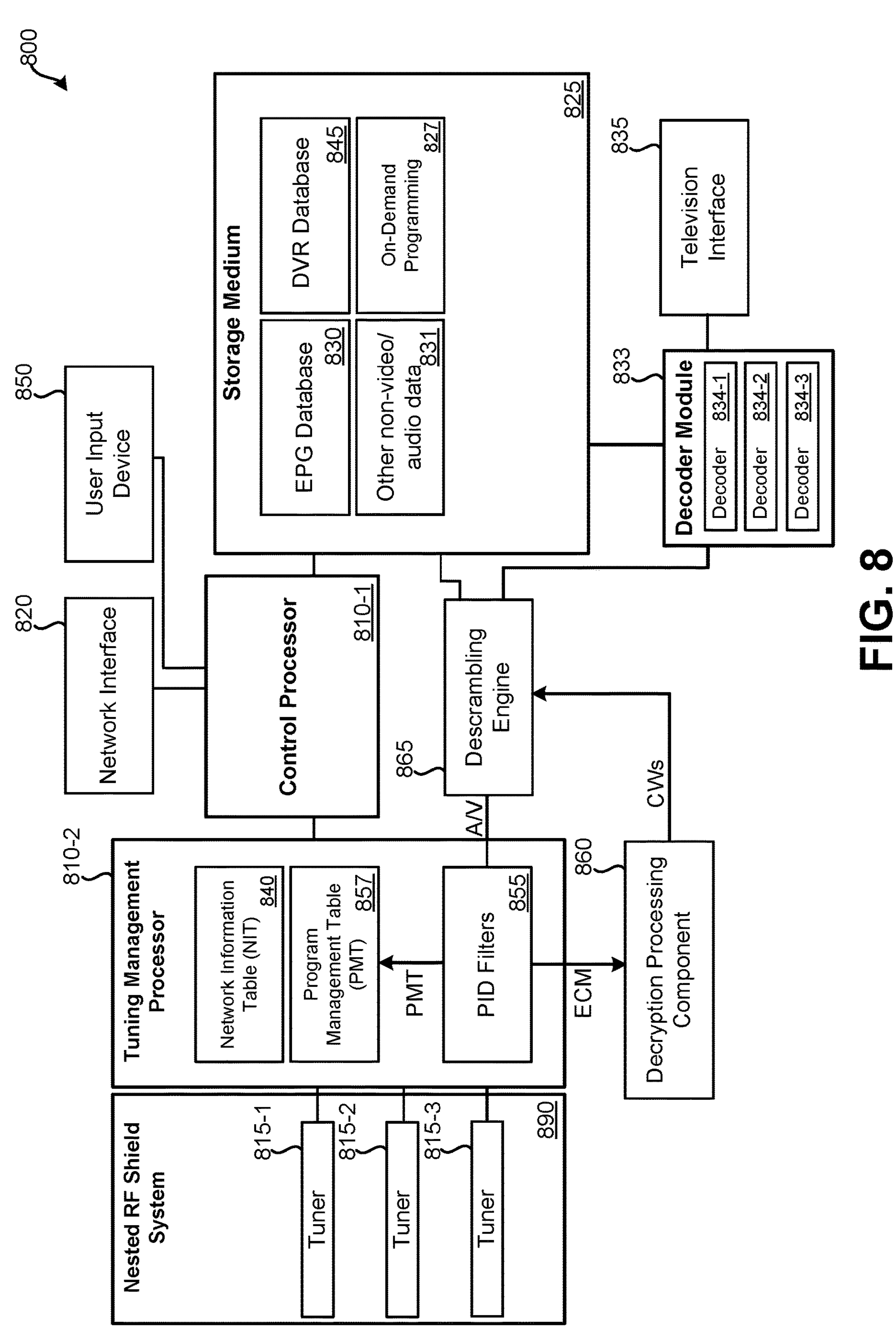
FIG. 8 illustrates an embodiment of a block diagram of a television receiver in which the nested RF shield system is present.

FIG. 8 represents a block diagram of a set top box in which the various nested RF shield systems detailed herein can be incorporated. Television receiver 800 may be in the form of a separate device configured to be connected with a display device, such as a television. Embodiments of television receiver 800 can include set top boxes (STBs). As previously noted, in addition to being in the form of an STB, a television receiver may be incorporated as part of another device, such as a television or other form of display device.

For example, a television may have an integrated television receiver (which does not involve an external STB being coupled with the television).

Television receiver 800 may be incorporated as part of a television. Television receiver 800 may include: processors 810 (which may include control processor 810-1, tuning management processor 810-2, and possibly additional processors), tuners 815, network interface 820, non-transitory computer-readable storage medium 825, electronic programming guide (EPG) database 830, television interface 835, networking information table (NIT) 840, digital video recorder (DVR) database 845 (which may include provider-managed television programming storage and/or user-defined television programming), on-demand programming 827, user profiles 847, programming preview database 848, user input device 850, decryption processing component 860 (which can be in the form of a removable or non-removable smartcard), and/or descrambling engine 865. In other embodiments of television receiver 800, fewer or greater numbers of components may be present. It should be understood that the various components of television receiver 800 may be implemented using hardware, firmware, software, and/or some combination thereof. Functionality of components may be combined; for example, functions of descrambling engine 865 may be performed by tuning management processor 810-2. Further, functionality of components may be spread among additional components; for example, PID (packet identifier) filters 855 may be handled by separate hardware from program management table 857.

Processors 810 may include one or more specialized and/or general-purpose processors configured to perform processes such as tuning to a particular channel, accessing and displaying EPG information from EPG database 830, and/or receiving and processing input from a user. For example, processors 810 may include one or more processors dedicated to decoding video signals from a particular format, such as MPEG, for output and display on a television and for performing decryption. It should be understood that the functions performed by various modules of FIG. 8 may be performed using one or more processors. As such, for example, functions of descrambling engine 865 may be performed by control processor 810-1.

Control processor 810-1 may communicate with tuning management processor 810-2. Control processor 810-1 may control the recording of television channels based on timers stored in DVR database 845. Control processor 810-1 may also provide commands to tuning management processor 810-2 when recording of a television channel is to cease. In addition to providing commands relating to the recording of television channels, control processor 810-1 may provide commands to tuning management processor 810-2 that indicate television channels to be output to decoder module 833 for output to a display device. Control processor 810-1 may also communicate with network interface 820 and user input device 850. Control processor 810-1 may handle incoming data from network interface 820 and user input device 850. Additionally, control processor 810-1 may be configured to output data via network interface 820.

Tuners 815 may include one or more tuners used to tune to transponders that include broadcasts of one or more television channels. Tuners 815 can be housed in a nested RF shield system as detailed in relation to FIGS. 1-7. Such as via an F-type connector, tuners 815 may receive RF signals from a dish antenna via a coaxial cable. In the illustrated embodiment of television receiver 800, three tuners are present (tuner 815-1, tuner 815-2, and tuner 815-3). In other embodiments, two or more than three tuners may be present, such as four, six, or eight tuners. Each tuner contained in tuners 815 may be capable of receiving and processing a single transponder stream from a satellite transponder at a given time. As such, a single tuner may tune to a single transponder stream at a given time. If tuners 815 include multiple tuners, one tuner may be used to tune to a television channel on a first transponder stream for display using a television, while another tuner may be used to tune to a television channel on a second transponder for recording and viewing at some other time. If multiple television channels transmitted on the same transponder stream are desired, a single tuner of tuners 815 may be used to receive the signal containing the multiple television channels for presentation and/or recording. Tuners 815 may receive commands from tuning management processor 810-2. Such commands may instruct tuners 815 which frequencies or transponder streams to tune.

Network interface 820 may be used to communicate via an alternate communication channel with a television service provider, if such communication channel is available. The primary communication channel may be via satellite (which may be unidirectional to television receiver 800) and the alternate communication channel (which may be bidirectional) may be via a network, such as the Internet. Network interface 820 may be configured to communicate via one or more networks, such as the Internet, to communicate with a television service provider system. Information may be transmitted and/or received via network interface 820. For instance, instructions (e.g., regarding subscription portability) from a television service provider may also be received via network interface 820, if connected with the Internet. Network interface 820 may be used to provide a confirmation to a television service provider that instructions received from the television service provider have indeed been executed.

Storage medium 825 may represent one or more non-transitory computer-readable storage mediums. Storage medium 825 may include memory and/or a hard drive. Storage medium 825 may be used to store information received from one or more satellites and/or information received via network interface 820. Storage medium 825 may store information related to EPG database 830, other non-video/audio data 831, DVR database 845, and/or on-demand programming 827. Recorded television programs, which were recorded based on a provider- or user-defined timer may be stored using storage medium 825 as part of a DVR database. Storage medium 825 may be partitioned or otherwise divided (such as into folders) such that predefined amounts of storage medium 825 are devoted to storage of television programs recorded due to user-defined timers and stored television programs recorded due to provider-defined timers.

EPG database 830 may store information related to television channels and the timing of programs appearing on such television channels. EPG database 830 may be stored using storage medium 825, which may be a hard drive. Information from EPG database 830 may be used to inform users of what television channels or programs are popular and/or provide recommendations to the user. Information from EPG database 830 may provide the user with a visual interface displayed by a television that allows a user to browse and select television channels and/or television programs for viewing and/or recording. Information used to populate EPG database 830 may be received via network interface 820 and/or via satellites via tuners 815. For instance, updates to EPG database 830 may be received periodically via satellite. EPG database 830 may serve as an interface for a user to control DVR functions of television receiver 800, and/or to enable viewing and/or recording of multiple television channels simultaneously.

The network information table (NIT) 840 may store information used by television receiver 800 to access various television channels. NIT 840 may be stored locally by a processor, such as tuning management processor 810-2 and/or by storage medium 825. Information used to populate NIT 840 may be received via satellite (or cable) through tuners 815 and/or may be received via network interface 820 from the television service provider. As such, information present in NIT 840 may be periodically updated. In some embodiments, NIT 840 may be locally-stored by television receiver 800 using storage medium 825. Generally, NIT 840 may store information about a service provider network, such as a satellite-based service provider network. Information that may be present in NIT 840 may include: television channel numbers, satellite identifiers (which may be used to ensure different satellites are tuned to for reception of timing signals), frequency identifiers and/or transponder identifiers for various television channels. In some embodiments, NIT 840 may contain additional data or additional tables may be stored by the television receiver. For example, while specific audio PIDs and video PIDs may not be present in NIT 840, a channel identifier may be present within NIT 840 which may be used to look up the audio PIDs and video PIDs in another table, such as a program map table (PMT). In some embodiments, a PID associated with the data for the PMT is indicated in a separate table, program association table (PAT), which is not illustrated in FIG. 8. A PAT may be stored by the television receiver in a similar manner to the NIT. For example, a PMT may store information on audio PIDs, and/or video PIDs. A PMT stores data on ECM (entitlement control message) PIDs for television channels that are transmitted on a transponder frequency. If, for a first television channel, multiple television channels are to be tuned to, NIT 840 and/or PMT 857 may indicate a second television channel that is to be tuned to when a first channel is tuned to.

Based on information in the NIT, it may be possible to determine the proper satellite and transponder to which to tune for a particular television channel. In some embodiments, the NIT may list a particular frequency to which to tune for a particular television channel. Once tuned to the proper satellite/transponder/frequency, the PMT PID may be used to retrieve a program management table that indicates the PIDs for audio and video streams of television channels transmitted by that transponder.

While a large portion of storage space of storage medium 825 is devoted to storage of television programming, a portion may be devoted to storage of non-audio/video data, such as EPG database 830 and other non-video/audio data 831. This "other" data may permit television receiver 800 to function properly. In some embodiments, at least ten gigabytes are allocated to such other data. For example, if NIT 840 is stored by storage medium 825, it may be part of other non-video/audio data 826.

Decoder module 833 may serve to convert encoded video and audio into a format suitable for output to a display device. For instance, decoder module 833 may receive MPEG video and audio from storage medium 825 or descrambling engine 865 to be output to a television. MPEG video and audio from storage medium 825 may have been recorded to DVR database 845 as part of a previously-recorded television program. Decoder module 833 may convert the MPEG video and audio into a format appropriate to be displayed by a television or other form of display device and audio into a format appropriate to be output from speakers, respectively. Decoder module 833 may have the ability to convert a finite number of television channel streams received from storage medium 825 or descrambling engine 865 simultaneously. For instance, each of decoders 834 within decoder module 833 may be able to only decode a single television channel at a time. While decoder module 833 is illustrated as having three decoders 834 (decoder 834-1, decoder 834-2, and decoder 834-3), in other embodiments, a greater or fewer number of decoders may be present in television receiver 800. A decoder may be able to only decode a single high definition television program at a time.

Television interface 835 may serve to output a signal to a television (or another form of display device) in a proper format for display of video and playback of audio. As such, television interface 835 may output one or more television channels, stored television programming from storage medium 825 (e.g., television programs from DVR database 845, television programs from on-demand programming 827 and/or information from EPG database 830) to a television for presentation.

Digital Video Recorder (DVR) functionality may permit a television channel to be recorded for a period of time. DVR functionality of television receiver 800 may be managed by control processor 810-1. Control processor 810-1 may coordinate the television channel, start time, and stop time of when recording of a television channel is to occur. DVR database 845 may store information related to the recording of television channels. DVR database 845 may store timers that are used by control processor 810-1 to determine when a television channel should be tuned to and its programs recorded to DVR database 845 of storage medium 825. In some embodiments, a limited amount of storage medium 825 may be devoted to DVR database 845. Timers may be set by the television service provider and/or one or more users of television receiver 800.

DVR database 845 may also be used to record recordings of service provider-defined television channels. For each day, an array of files may be created. For example, based on provider-defined timers, a file may be created for each recorded television channel for a day. For example, if four television channels are recorded from 6-10 PM on a given day, four files may be created (one for each television channel). Within each file, one or more television programs may be present. The service provider may define the television channels, the dates, and the time periods for which the television channels are recorded for the provider-defined timers. The provider-defined timers may be transmitted to television receiver 800 via the television provider's network. For example, referring to satellite-based television distribution system 100 of FIG. 1, in a satellite-based television service provider system, data necessary to create the provider-defined timers at television receiver 150 may be received via satellite.

As an example of DVR functionality of television receiver 800 being used to record based on provider-defined timers, a television service provider may configure television receiver 800 to record television programming on multiple, predefined television channels for a predefined period of time, on predefined dates. For instance, a television service provider may configure television receiver 800 such that television programming may be recorded from 7 to 10 PM on NBC, ABC, CBS, and FOX on each weeknight and from 6 to 10 PM on each weekend night on the same channels. These channels may be transmitted as part of a single transponder stream such that only a single tuner needs to be used to receive the television channels. Packets for such television channels may be interspersed and may be received and recorded to a file. If a television program is selected for recording by a user and is also specified for recording by the television service provider, the user selection may serve as an indication to save the television program for an extended time (beyond the time which the predefined recording would otherwise be saved). Television programming recorded based on provider-defined timers may be stored to a portion of storage medium 825 for provider-managed television programming storage.

On-demand programming 827 may represent additional television programming stored by storage medium 825. On-demand programming 827 may include television programming that was not recorded to storage medium 825 via a timer (either user- or provider-defined). Rather, on-demand programming is programming provided to the television receiver directly for storage by the television receiver and for later presentation to one or more users. On-demand programming may not be user-selected. As such, the television programming stored to on-demand programming storage 827 may be the same for each television receiver of a television service provider.

User input device 850 may include a remote control (physically separate from television receiver 800) and/or one or more buttons on television receiver 800 that allow a user to interact with television receiver 800. User input device 850 may be used to select a television channel for viewing, view information from EPG database 830, and/or program a timer stored to DVR database 845, wherein the timer is used to control the DVR functionality of control processor 810-1. In some embodiments, it may be possible to load some or all of preferences to a remote control. As such, the remote control can serve as a backup storage device for the preferences.

Referring back to tuners 815, television channels received via satellite (or cable) may contain at least some scrambled data. Packets of audio and video may be scrambled to prevent unauthorized users (e.g., nonsubscribers) from receiving television programming without paying the television service provider. When a tuner of tuners 815 is receiving data from a particular transponder of a satellite, the transponder stream may be a series of data packets corresponding to multiple television channels. Each data packet may contain a packet identifier (PID), which, in combination with NIT 840 and/or PMT 857, can be determined to be associated with a particular television channel. Particular data packets, referred to as entitlement control messages (ECMs), may be periodically transmitted. ECMs may be associated with another PID and may be encrypted; television receiver 800 may use decryption engine 861 of decryption processing component 860 to decrypt ECMs. Decryption of an ECM may only be possible if the user has authorization to access the particular television channel associated with the ECM. When an ECM is determined to correspond to a television channel being stored and/or displayed, the ECM may be provided to decryption processing component 860 for decryption.

When decryption processing component 860 receives an encrypted ECM, decryption processing component 860 may decrypt the ECM to obtain some number of control words. In some embodiments, from each ECM received by decryption processing component 860, two control words are obtained. In some embodiments, when decryption processing component 860 receives an ECM, it compares the ECM to the previously received ECM. If the two ECMs match, the second ECM is not decrypted because the same control words would be obtained. In other embodiments, each ECM received by decryption processing component 860 is decrypted; however, if a second ECM matches a first ECM, the outputted control words will match; thus, effectively, the second ECM does not affect the control words output by decryption processing component 860. Decryption processing component 860 may be permanently part of television receiver 800 or may be configured to be inserted and removed from television receiver 800.

Tuning management processor 810-2 may be in communication with tuners 815 and control processor 810-1. Tuning management processor 810-2 may be configured to receive commands from control processor 810-1. Such commands may indicate when to start/stop recording a television channel and/or when to start/stop causing a television channel to be output to a television. Tuning management processor 810-2 may control tuners 815. Tuning management processor 810-2 may provide commands to tuners 815 that instruct the tuners which satellite, transponder, and/or frequency to tune to. From tuners 815, tuning management processor 810-2 may receive transponder streams of packetized data. As previously detailed, some or all of these packets may include a PID that identifies the content of the packet.

Tuning management processor 810-2 may be configured to create one or more PID filters 855 that sort packets received from tuners 815 based on the PIDs. When a tuner is initially tuned to a particular frequency (e.g., to a particular transponder of a satellite), a PID filter may be created based on the PMT data. The PID filter created, based on the PMT data packets, may be known because it is stored as part of NIT 840 or another table, such as a program association table (PAT). From the PMT data packets, PMT may be constructed by tuning management processor 810-2.

PID filters 855 may be configured to filter data packets based on PIDs. In some embodiments, PID filters 855 are created and executed by tuning management processor 810-2. For each television channel to be output for presentation or recorded, a separate PID filter may be configured. In other embodiments, separate hardware may be used to create and execute such PID filters. Depending on a television channel selected for recording/viewing, a PID filter may be created to filter the video and audio packets associated with the television channel (based on the PID assignments present in PMT 857). For example, if a transponder data stream includes multiple television channels, data packets corresponding to a television channel that is not desired to be stored or displayed by the user may be ignored by PID filters 855. As such, only data packets corresponding to the one or more television channels desired to be stored and/or displayed may be filtered and passed to either descrambling engine 865 or decryption processing component 860; other data packets may be ignored. For each television channel, a stream of video packets, a stream of audio packets (one or both of the audio programs) and/or a stream of ECM packets may be present, each stream identified by a PID. In some embodiments, a common ECM stream may be used for multiple television channels. Additional data packets corresponding to other information, such as updates to NIT 840, may be appropriately routed by PID filters 855. At a given time, one or multiple PID filters may be executed by tuning management processor 810-2.

Descrambling engine 865 may use the control words output by decryption processing component 860 in order to descramble video and/or audio corresponding to television channels for storage and/or presentation. Video and/or audio data contained in the transponder data stream received by tuners 815 may be scrambled. Video and/or audio data may be descrambled by descrambling engine 865 using a particular control word. Which control word output by decryption processing component 860 to be used for successful descrambling may be indicated by a scramble control identifier present within the data packet containing the scrambled video or audio. Descrambled video and/or audio may be output by descrambling engine 865 to storage medium 825 for storage (in DVR database 845) and/or to decoder module 833 for output to a television or other presentation equipment via television interface 835.

For simplicity, television receiver 800 of FIG. 8 has been reduced to a block diagram; commonly known parts, such as a power supply, have been omitted. Further, some routing between the various modules of television receiver 800 has been illustrated. Such illustrations are for exemplary purposes only. The state of two modules not being directly or indirectly connected does not indicate the modules cannot communicate. Rather, connections between modules of the television receiver 800 are intended only to indicate possible common data routing. It should be understood that the modules of television receiver 800 may be combined into a fewer number of modules or divided into a greater number of modules. Further, the components of television receiver 800 may be part of another device, such as built into a television.

It should be noted that the methods, systems, and devices discussed above are intended merely to be examples. It must be stressed that various embodiments may omit, substitute, or add various procedures or components as appropriate. For instance, it should be appreciated that, in alternative embodiments, the methods may be performed in an order different from that described, and that various steps may be added, omitted, or combined. Also, features described with respect to certain embodiments may be combined in various other embodiments. Different aspects and elements of the embodiments may be combined in a similar manner. Also, it should be emphasized that technology evolves and, thus, many of the elements are examples and should not be interpreted to limit the scope of the invention.

Specific details are given in the description to provide a thorough understanding of the embodiments. However, it will be understood by one of ordinary skill in the art that the embodiments may be practiced without these specific details. For example, well-known, processes, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing embodiments of the invention. Various changes may be made in the function and arrangement of elements without departing from the spirit and scope of the invention.

Also, it is noted that the embodiments may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure.

Having described several embodiments, it will be recognized by those of skill in the art that various modifications, alternative constructions, and equivalents may be used without departing from the spirit of the invention. For example, the above elements may merely be a component of a larger system, wherein other rules may take precedence over or otherwise modify the application of the invention. Also, a number of steps may be undertaken before, during, or after the above elements are considered. Accordingly, the above description should not be taken as limiting the scope of the invention.

What is claimed is:

1. A nested radio frequency (RF) shield system, comprising:
- an internal RF shield, comprising:
  - a first metallic housing;
  - a first plurality of tabs to be soldered to a printed circuit board (PCB), the first plurality of tabs attached with the first metallic housing; and
  - a first plurality of protrusions present on the first metallic housing, wherein when a first tab of the first plurality of tabs is inserted into the PCB, the first tab causes a first protrusion of the first plurality of protrusions to be pushed in a first direction; and
- an external RF shield, comprising:
  - a second metallic housing;
  - an RF connector attached with the second metallic housing;
  - a second plurality of tabs to be soldered to the PCB; and
  - a second plurality of protrusions present on the second metallic housing,
- wherein:
  - each protrusion of the second plurality of protrusions extends to a bottom of a corresponding sidewall of the second metallic housing to allow the second plurality of protrusions to slide onto the first plurality of protrusions;
  - when the internal RF shield and the external RF shield are installed on the PCB, the first plurality of protrusions and the second plurality of protrusions nest together; and
  - when a second tab of the second plurality of tabs is inserted into the PCB, the second tab causes a second protrusion of the second plurality of protrusions to be pushed in a second direction, opposite direction from the first direction, against the first protrusion of the first plurality of protrusions.

2. The nested RF shield system of claim 1, wherein each protrusion of the first plurality of protrusions and the second plurality of protrusions are concave in shape.

3. The nested RF shield system of claim 1, wherein each protrusion of the second plurality of protrusions has a larger radius than each protrusion of the first plurality of protrusions.

4. The nested RF shield system of claim 1, wherein the external RF shield further comprises an F-type connector that passes through the second metallic housing.

5. The nested RF shield system of claim 1, wherein the nested RF shield system is installed with a television set top box (STB).

6. A method for performing shielding of a tuner circuit, the method comprising:
- installing an internal RF shield by soldering a plurality of tabs of the internal RF shield to a printed circuit board (PCB), wherein when a first tab of the first plurality of tabs is inserted into the PCB, the first tab causes a first protrusion of a first plurality of protrusions to be pushed in a first direction;
- positioning an external RF shield onto the PCB such that the first plurality of protrusions of the internal RF shield and a second plurality of protrusions of the external RF shield nest together, wherein:

when a second tab of the second plurality of tabs is inserted into the PCB, the second tab causes a second protrusion of the second plurality of protrusions to be pushed in a second direction, opposite direction from the first direction, against the first protrusion of the first plurality of protrusions;

each protrusion of the second plurality of protrusions extends to a bottom of a corresponding sidewall of a second metallic housing to allow the second plurality of protrusions to slide onto the first plurality of protrusions; and when the internal RF shield and the external RF shield are installed on the PCB, the first plurality of protrusions and the second plurality of protrusions nest together; and after positioning the external RF shield onto the PCB, soldering a second plurality of tabs of the external RF shield onto the PCB.

7. The method for performing shielding of the tuner circuit of claim 6, further comprising:

removing solder from the second plurality of tabs of the external RF shield; and removing the external RF shield from the PCB while leaving the internal RF shield installed.

8. The method for performing shielding of the tuner circuit of claim 7 further comprising:

positioning a second external RF shield onto the PCB such that the first plurality of protrusions of the internal RF shield and a third plurality of protrusions of the second external RF shield nest together; and after positioning the second external RF shield onto the PCB, solder a third plurality of tabs of the external RF shield onto the PCB.

9. The method for performing shielding of the tuner circuit of claim 6, wherein positioning the external RF shield onto the PCB comprises sliding the second plurality of protrusions onto the first plurality of protrusions.

10. The method for performing shielding of the tuner circuit of claim 6, further comprising:

after positioning the external RF shield onto the PCB, causing force between the internal RF shield and the external RF shield to be exerted, the force caused by a retaining tab inserted into the PCB.

11. The method for performing shielding of the tuner circuit of claim 8, further comprising:

connecting an F-type connector present on the external RF shield with a coaxial cable that is connected with an external antenna.

12. A set top box, comprising:

a tuner circuit;

an internal RF shield, comprising:

a first metallic housing;

a first plurality of tabs to be soldered to a printed circuit board (PCB), the first plurality of tabs attached with the first metallic housing; and a first plurality of protrusions present on the first metallic housing, wherein when a first tab of the first plurality of tabs is inserted into the PCB, the first tab causes a first protrusion of the first plurality of protrusions to be pushed in a first direction; and an external RF shield, comprising:

a second metallic housing;

an RF connector attached with the second metallic housing;

a second plurality of tabs to be soldered to the PCB; and a second plurality of protrusions present on the second metallic housing, wherein:

the tuner circuit is located within the internal RF shield;

each protrusion of the second plurality of protrusions extends to a bottom of a corresponding sidewall of the second metallic housing to allow the second plurality of protrusions to slide onto the first plurality of protrusions;

when the internal RF shield and the external RF shield are installed on the PCB, the first plurality of protrusions and the second plurality of protrusions nest together; and when a second tab of the second plurality of tabs is inserted into the PCB, the second tab causes a second protrusion of the second plurality of protrusions to be pushed in a second direction, opposite direction from the first direction, against the first protrusion of the first plurality of protrusions.

13. The set top box of claim 12, wherein each protrusion of the second plurality of protrusions has a larger radius than each protrusion of the first plurality of protrusions.

14. The set top box of claim 12, wherein each protrusion of the second plurality of protrusions has a different radius than each protrusion of the first plurality of protrusions.

15. The set top box of claim 14, wherein the tuner circuit comprises a plurality of tuners.

16. The set top box of claim 15, wherein the external RF shield further comprises an F-type connector that passes through the second metallic housing and connects with an external dish antenna via coaxial cable.

* * * * *